(12) United States Patent
Ozawa

(10) Patent No.: US 10,861,514 B2
(45) Date of Patent: Dec. 8, 2020

(54) DATA TRANSMISSION AND RECEPTION SYSTEM, DATA TRANSMISSION AND RECEPTION DEVICE, AND METHOD OF CONTROLLING DATA TRANSMISSION AND RECEPTION SYSTEM

(71) Applicant: FUJITSU LIMITED, Kawasaki (JP)

(72) Inventor: Toshiaki Ozawa, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 80 days.

(21) Appl. No.: 16/162,438

(22) Filed: Oct. 17, 2018

(65) Prior Publication Data

US 2019/0122712 A1 Apr. 25, 2019

(30) Foreign Application Priority Data

Oct. 24, 2017 (JP) .................. 2017-205456

(51) Int. Cl.
*G11C 7/22* (2006.01)
*G11C 29/56* (2006.01)
*G06F 1/04* (2006.01)
*G11C 29/12* (2006.01)
*G06F 13/16* (2006.01)
*G11C 29/02* (2006.01)
(Continued)

(52) U.S. Cl.
CPC .................. *G11C 7/22* (2013.01); *G06F 1/04* (2013.01); *G06F 13/1689* (2013.01); *G11C 7/222* (2013.01); *G11C 29/1201* (2013.01); *G11C 29/56012* (2013.01); *G11C 5/04* (2013.01); *G11C 7/1066* (2013.01); *G11C 7/1093* (2013.01); *G11C 29/022* (2013.01); *G11C 29/023* (2013.01); *G11C 29/028* (2013.01); *G11C 2207/2254* (2013.01)

(58) Field of Classification Search
CPC .................................... G11C 7/22; G06F 1/04
See application file for complete search history.

(56) References Cited

U.S. PATENT DOCUMENTS 5,469,288 A * 11/1995 Onaka ................ G02B 6/29358
372/92
6,343,022 B1 * 1/2002 Naruse ............... G06K 19/0701
323/347
(Continued)

FOREIGN PATENT DOCUMENTS

JP 2012-194686 10/2012
JP 2016-197275 11/2016

*Primary Examiner* — Muna A Techane
(74) *Attorney, Agent, or Firm* — Fujitsu Patent Center

(57) ABSTRACT

A system includes: a first device; a second device connected to the first device via a transmission line; and control devices that are coupled to the first and second devices and control transmission and reception of a data signal and a timing signal between the first device and the second device, wherein the first device: determines a combination of phases with which a range of a voltage of determination as to whether the data signal is acquired is wider than a range of a voltage in which the data signal is acquired in other combinations of phases in information including combinations of phases in which a phase of the timing signal is specified for each data line in the transmission line, when the second device is operated according to the combinations of phases based on the information; and controls the second device based on the combination of the phases.

15 Claims, 17 Drawing Sheets

(51) Int. Cl.
*G11C 5/04* (2006.01)
*G11C 7/10* (2006.01)

(56) References Cited

U.S. PATENT DOCUMENTS

| | | | |
|---|---|---|---|
| 7,123,524 B1* | 10/2006 | Han | G11C 7/1051 |
| | | | 365/193 |
| 2012/0327726 A1* | 12/2012 | Tsern | G11C 11/4074 |
| | | | 365/189.11 |
| 2013/0232372 A1* | 9/2013 | Sakamaki | G11C 5/04 |
| | | | 713/500 |
| 2016/0293237 A1* | 10/2016 | Ozawa | G11C 29/56012 |

* cited by examiner

*FIG. 5*

| bit | 7 | 6 | 5 | 4 | 3 | 2 | 1 | 0 |
|---|---|---|---|---|---|---|---|---|
| CONTENT | SETTING VALUE | | | | | | | |

FIG. 6

| MC | SLOT | DQS GROUP | Case1 DELAY (ps) [PHASE (°)] | Case1 TRANSMISSION AMPLITUDE (code) | Case2 DELAY (ps) [PHASE (°)] | Case2 TRANSMISSION AMPLITUDE (code) | Case3 DELAY (ps) [PHASE (°)] | Case3 TRANSMISSION AMPLITUDE (code) |
|---|---|---|---|---|---|---|---|---|
| MC0 | DIMM0 | DQS[17:0] | +−0[+−0] | 10 | +−0[+−0] | 9 | +−0[+−0] | 11 |
| MC0 | DIMM1 | DQS[17:0] | +−0[+−0] | 10 | +−0[+−0] | 9 | +1/8[+45] | 11 |
| MC1 | DIMM0 | DQS[17:0] | +1/8[+45] | 11 | +−0[+−0] | 10 | +2/8[+90] | 12 |
| MC1 | DIMM1 | DQS[17:0] | +1/8[+45] | 11 | +−0[+−0] | 10 | +3/8[+135] | 12 |
| MC2 | DIMM0 | DQS[17:0] | +2/8[+90] | 10 | +2/8[+90] | 9 | +−0[+−0] | 11 |
| MC2 | DIMM1 | DQS[17:0] | +2/8[+90] | 10 | +2/8[+90] | 9 | +1/8[+45] | 11 |
| MC3 | DIMM0 | DQS[17:0] | +3/8[+135] | 11 | +2/8[+90] | 10 | +2/8[+90] | 12 |
| MC3 | DIMM1 | DQS[17:0] | +3/8[+135] | 11 | +2/8[+90] | 10 | +3/8[+135] | 12 |

SHIFT PHASE IN MC UNIT

SHIFT PHASE IN DIMM UNIT

FIG. 12

| DQS GROUP | | DQ | Case1 CYCLE (tCK) [PHASE (°)] | Case1 TRANSMISSION AMPLITUDE (code) | Case2 CYCLE (tCK) [PHASE (°)] | Case2 TRANSMISSION AMPLITUDE (code) | Case3 CYCLE (tCK) [PHASE (°)] | Case3 TRANSMISSION AMPLITUDE (code) |
|---|---|---|---|---|---|---|---|---|
| DQS<0> | ⎫ | DQ[3:0] | −1/8[−45] | 10 | −1/8[−45] | 10 | +−0[+−0] | 9 |
| DQS<9> | ⎬ Grp.1 | DQ[7:4] | −1/8[−45] | 10 | −1/8[−45] | 10 | +−0[+−0] | 9 |
| DQS<1> | ⎬ | DQ[11:8] | −1/8[−45] | 10 | −1/8[−45] | 10 | +−0[+−0] | 9 |
| DQS<10> | ⎭ | DQ[15:12] | −1/8[−45] | 10 | −1/8[−45] | 10 | +−0[+−0] | 9 |
| DQS<2> | ⎫ | DQ[19:16] | +−0[+−0] | 9 | −1/8[−45] | 10 | +1/8[+45] | 9 |
| DQS<11> | ⎬ Grp.2 | DQ[23:20] | +−0[+−0] | 9 | −1/8[−45] | 10 | +1/8[+45] | 9 |
| DQS<3> | ⎬ | DQ[27:24] | +−0[+−0] | 9 | −1/8[−45] | 10 | +1/8[+45] | 9 |
| DQS<12> | ⎭ | DQ[31:28] | +−0[+−0] | 9 | −1/8[−45] | 10 | +1/8[+45] | 9 |
| DQS<4> | ⎫ | DQ[35:32] | +−0[+−0] | 9 | −1/8[−45] | 10 | +1/8[+45] | 9 |
| DQS<13> | ⎬ Grp.3 | DQ[39:36] | +1/8[+45] | 8 | +1/8[+45] | 11 | +−0[+−0] | 9 |
| DQS<5> | ⎬ | DQ[43:40] | +1/8[+45] | 8 | +1/8[+45] | 11 | +−0[+−0] | 9 |
| DQS<14> | ⎭ | DQ[47:44] | +1/8[+45] | 8 | +1/8[+45] | 11 | +−0[+−0] | 9 |
| DQS<6> | ⎫ | DQ[51:48] | +1/8[+45] | 8 | +1/8[+45] | 11 | +−0[+−0] | 9 |
| DQS<15> | ⎬ Grp.4 | DQ[55:52] | +2/8[+90] | 9 | +1/8[+45] | 11 | +1/8[+45] | 9 |
| DQS<7> | ⎬ | DQ[59:56] | +2/8[+90] | 9 | +1/8[+45] | 11 | +1/8[+45] | 9 |
| DQS<16> | ⎬ | DQ[63:60] | +2/8[+90] | 9 | +1/8[+45] | 11 | +1/8[+45] | 9 |
| DQS<8> | ⎬ | DQ[67:64] | +2/8[+90] | 9 | +1/8[+45] | 11 | +1/8[+45] | 9 |
| DQS<17> | ⎭ | DQ[71:68] | +2/8[+90] | 9 | +1/8[+45] | 11 | +1/8[+45] | 9 |

DATA TRANSMISSION AND RECEPTION SYSTEM, DATA TRANSMISSION AND RECEPTION DEVICE, AND METHOD OF CONTROLLING DATA TRANSMISSION AND RECEPTION SYSTEM

CROSS-REFERENCE TO RELATED APPLICATION

This application is based upon and claims the benefit of priority of the prior Japanese Patent Application No. 2017-205456, filed on Oct. 24, 2017, the entire contents of which are incorporated herein by reference.

FIELD

The embodiment discussed herein is related to a data transmission and reception system, a data transmission and reception device, and a method of controlling a data transmission and reception system.

BACKGROUND

A data strobe signal (DQS signal) has been used for writing and reading a multiple-bit data signal (DQ signal) when a central processing unit (CPU) inputs/outputs data to/from a memory.

Related art is disclosed in Japanese Laid-open Patent Publication No. 2016-197275 or Japanese Laid-open Patent Publication No. 2012-194686.

SUMMARY

According to an aspect of the embodiments, a data transmission and reception system includes: a first data transmission and reception device; a second data transmission and reception device connected to the first data transmission and reception device via a transmission line; and a plurality of control devices that are coupled to the first data transmission and reception device and the second data transmission and reception device and control transmission and reception of a data signal and a timing signal indicating a timing to acquire the data signal between the first data transmission and reception device and the second data transmission and reception device, wherein the first data transmission and reception device: determines a combination of phases with which a range of a voltage to be a reference of determination as to whether the data signal is acquired is wider than a range of a voltage in which the data signal is acquired in other combinations of phases included in information that includes a plurality of combinations of phases in which a phase of the timing signal relative to each data signal is specified for each of a plurality of data lines included in the transmission line, in a case where the second data transmission and reception device is operated according to the combinations of phases based on the information; and controls the second data transmission and reception device based on the determined combination of the phases.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 5 is a diagram illustrating an example of a register according to the embodiment;

FIG. 6 is a diagram illustrating an example of a combination of delay taps according to the embodiment;

FIG. 12 is a diagram illustrating another example of a combination of delay taps according to the embodiment;

DESCRIPTION OF EMBODIMENTS

Figure 1:
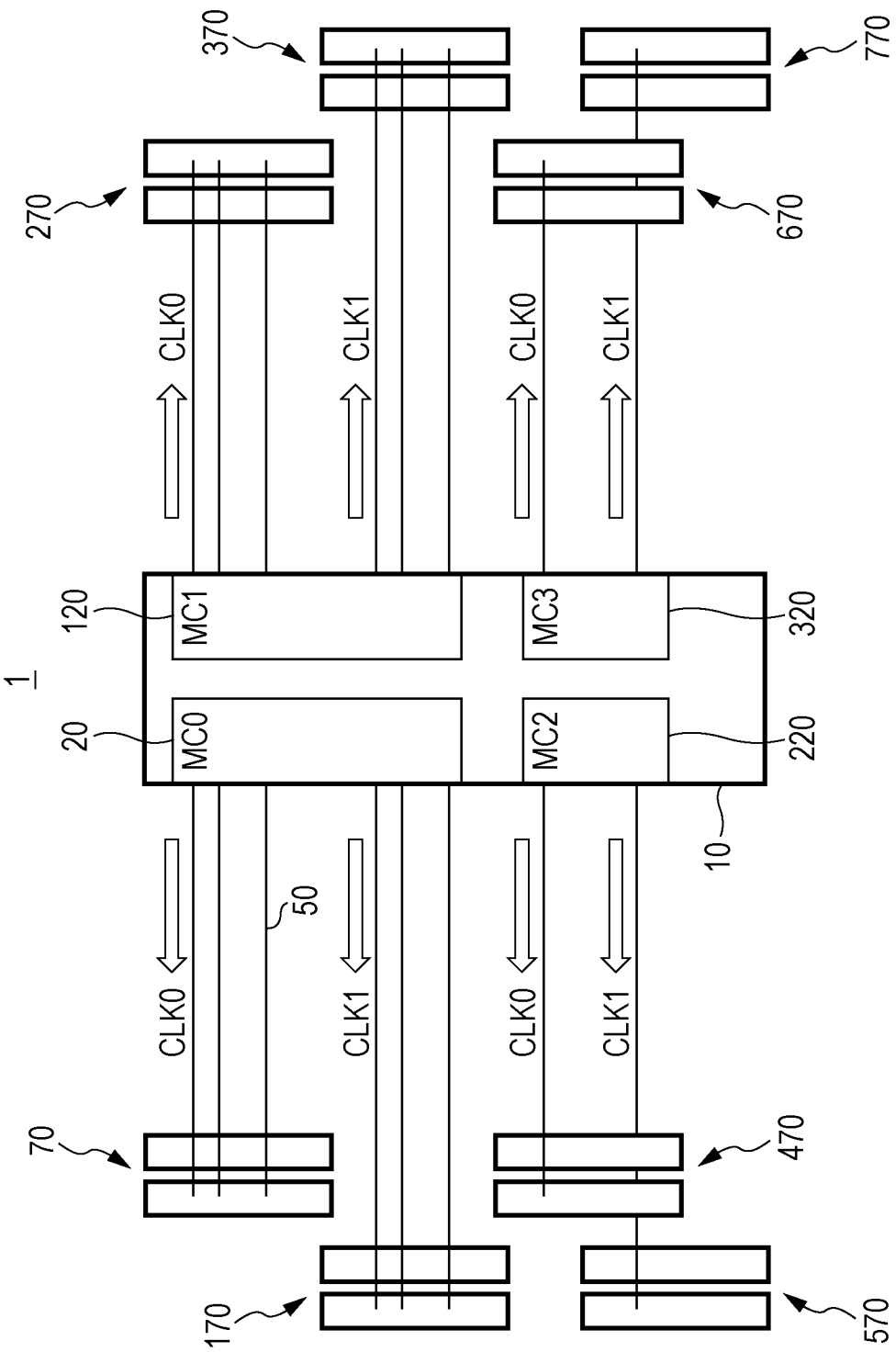
FIG. 1 is a diagram illustrating an exemplary configuration of a data transmission and reception system according to an embodiment.

A phase of the DQS signal relative to the DQ signal is fixed, and for example, a leading edge of the DQS signal is set as a strobe point which is a reading and writing timing of the DQ signal. A plurality of bits of the DQ signal is grouped as a single group, and the multiple-bit DQ signal is read and written in response to the single DQS signal. Since DQ signals of different bits are respectively transmitted via different transmission lines, a phase difference (skew) occurs between the DQ signals. Therefore, the phase of each of the DQ signals is adjusted to be the same phase based on the strobe point of the DQS signal as a reference.

Further, the phases of the DQS signal and the DQ signal are adjusted using a so-called eye pattern. First, in a reference voltage direction and a phase direction of the DQ signal in the eye pattern, a phase at which a width of the reference voltage becomes maximum and a voltage having a maximum phase width in which the data of the DQ signal may be acquired are determined. Further, the strobe point between the DQ signal and the DQS signal is optimized using the determined phase and voltage.

In memory access using a large number of memories, a plurality of memory modules is coupled to a transmission line to increase a storage capacity per memory channel. However, the connection of the plurality of memory modules increases branches of the transmission line. Therefore, at each branch point, impedance mismatching between the transmission line and the memory module occurs, and multiple reflection of the transmitted signals may occur.

Therefore, a technique has been proposed for estimating a phase having a long period during which the data signal may be effectively acquired for each reference voltage of each memory module and optimizing the strobe point between the DQ signal and the DQS signal based on the estimated phase.

However, for example, when the CPU includes a plurality of memory controllers, the strobe point may fluctuate due to an influence of a power supply noise generated by an operation of the CPU and a noise related to an operation timing of data access in the memory controllers. In this way, when the data signal is acquired between the data transmission and reception devices such as the CPU and the memory, there is a possibility that the acquisition timing of the data signal optimized by the above technique is not actually an optimum acquisition timing when the device is operated.

In view of the above circumstances, a data transmission and reception system capable of controlling an operation of a data transmission and reception device so as to increase a possibility to successfully acquire a data signal may be provided.

Hereinafter, an embodiment according to the technique of the present disclosure will be described with reference to the drawings. Note that the detailed description below is merely exemplary and does not limit the configuration of the embodiment.

A data transmission and reception system 1 according to an embodiment will be described with reference to FIG. 1. The data transmission and reception system 1 includes a central processing unit (CPU) 10, memory controllers (MC) #0 20, MC #1 120, MC #2 220, and MC #3 320, and memory modules 70, 170, 270, 370, 470, 570, 670, and 770. Note that the CPU 10 is an example of a first data transmission and reception device. Further, the MC #0 20, the MC #1 120, the MC #2 220, and the MC #3 320 are examples of a control device. Further, the memory modules 70, 170, 270, 370, 470, 570, 670, and 770 are examples of a second data transmission and reception device.

As illustrated in FIG. 1, for example, the MC #0 20 is coupled to the memory module 70 via a transmission line 50. Further, the MC #0 20 is coupled to the memory module 170 via a transmission line different from the transmission line 50. Similarly, the MC #1 120 is coupled to the memory modules 270 and 370 via different transmission lines, respectively. Further, the MC #2 220 is coupled to the memory modules 470 and 570 via different transmission lines, respectively. Further, the MC #3 320 is coupled to the memory modules 670 and 770 via different transmission lines, respectively.

The CPU 10 controls an operation of each unit in the data transmission and reception system 1 and performs processes to be described later. The MC #0 20, the MC #1 120, the MC #2 220, and the MC #3 320 generate DQS signals, generate DQ signals with a predetermined pattern such as a pseudo random bit sequence (PRBS) test pattern, and determine whether the DQ signals are successfully read or not with respect to reference voltages (Vref). Further, the DQS signal is an example of a strobe signal and a timing signal that indicates an acquisition timing of a data signal. Further, the DQ signal is an example of a data signal. Further, the reference voltage is an example of a voltage to be a reference for determining whether the data signal may be acquired. Each of the memory modules 70, 170, 270, 370, 470, 570, 670, and 770 includes a plurality of memory elements that store data. In the following description, it is assumed that the memory module is a dual in-line memory module (DIMM).

The MC #0 20 controls transmission of a memory clock signal CLK0 to the memory module 70 and transmission of a memory clock signal CLK1 to the memory module 170. The MC #1 120, the MC #2 220, and the MC #3 320 respectively control transmission of the memory clock signals CLK0 to the memory modules 270, 470, and 670 and transmission of the memory clock signals CLK1 to the memory modules 370, 570, and 770.

Figure 2:
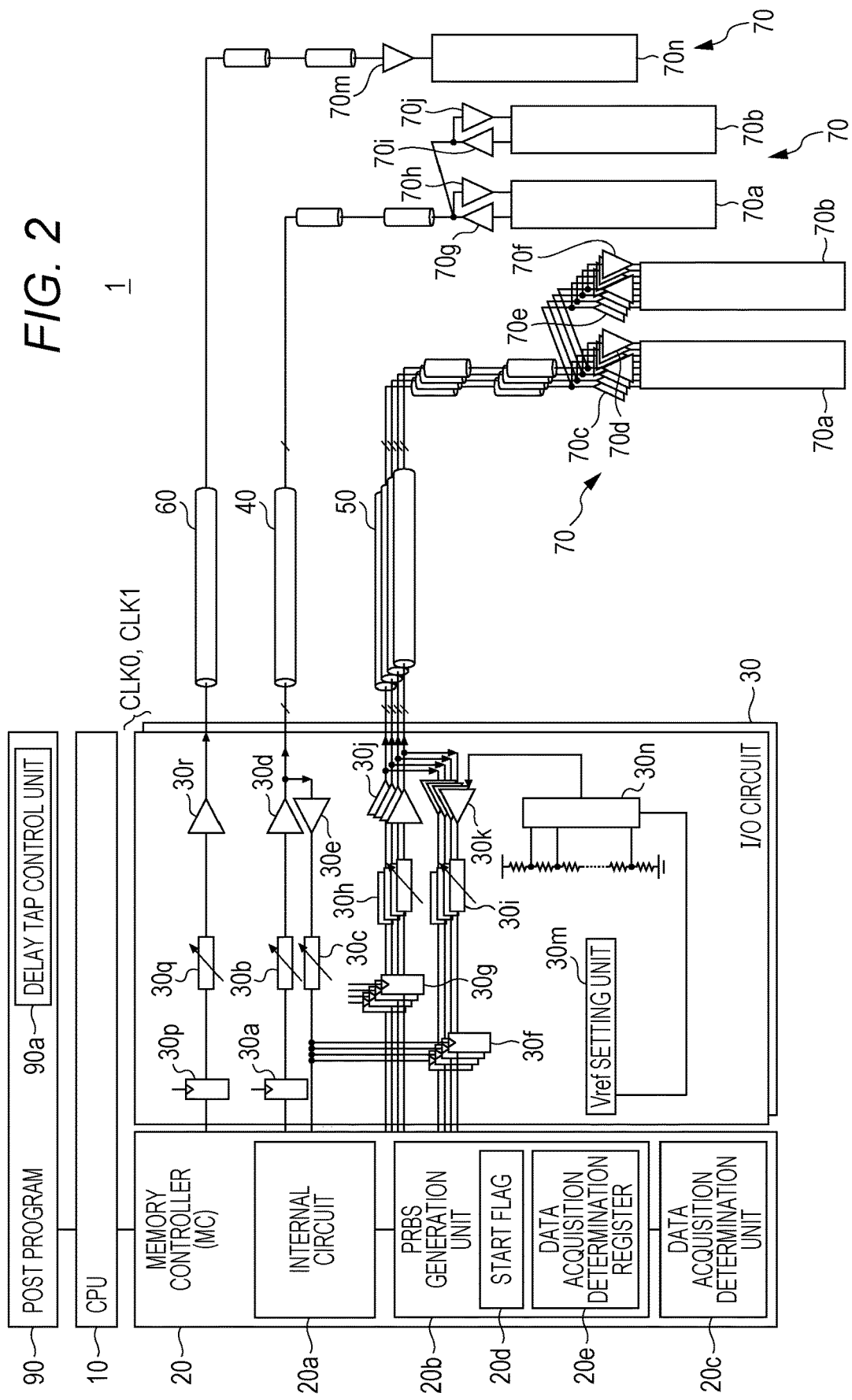
FIG. 2 is a diagram, different from FIG. 1, of the configuration of the data transmission and reception system according to the embodiment.

FIG. 2 illustrates the CPU 10, the MC #0 20, an input/output (I/O) circuit 30, transmission lines 40, 50, and 60, and the memory module 70 according to the present embodiment. The MC #0 20 includes an internal circuit 20a, a PRBS generation unit 20b, a data acquisition determination unit 20c, a start flag 20d, and a data acquisition determination register 20e. Further, since the MC #1 120, the MC #2 220, and the MC #3 320 have the same configuration as the MC #0 20, the description thereof is omitted here.

The I/O circuit 30 outputs the memory clock signal CLK0 to the memory module 70. The I/O circuit 30 includes latch circuits 30a, 30f, 30g, and 30p, delay tap setting units 30b, 30c, 30h, 30i, and 30q, drivers 30d, 30j, and 30r, receivers 30e and 30k, a reference voltage (Vref) setting unit 30m, and a voltage-dividing circuit 30n. The memory module 70 includes a Rank0 memory element 70a, a Rank1 memory element 70b, drivers 70c and 70e, receivers 70d, 70f, and 70m, and a registered clock driver (RCD) 70n. Further, in FIG. 2, two pairs of the memory elements 70a and the memory elements 70b of the memory module 70 are illustrated, and each memory element is the same memory element.

In the present embodiment, the MC #0 20 is coupled to an I/O circuit that outputs the memory clock signal CLK1 and is coupled to the memory module 170 via a transmission line. The memory module 170 has a configuration corresponding to the memory module 70. Further, the transmission line coupled to the memory module 170 is similar to the transmission lines 40, 50, and 60. Further, the I/O circuit coupled to the memory module 170 has a configuration corresponding to the I/O circuit 30.

The internal circuit 20a of the MC #0 20 outputs, to the I/O circuit 30, a PRBS test pattern generated by the PRBS generation unit 20b. The PRBS generation unit 20b generates a DQ signal with the PRBS test pattern. Here, the PRBS test pattern is not a pattern including combinations of regularly-arranged bits such as a pattern in which bits of "0" and bits of "1" are alternately arranged, but a pattern using pseudorandom numbers in which order of the numbers "0" and "1" are determined by deterministic calculation. Therefore, the DQ signal of the PRBS test pattern may be assumed as a signal equivalent to the DQ signal used to actually transfer data.

The start flag 20d is a flag used as a trigger for starting a phase setting process according to the present embodiment, and for example, the CPU 10 sets the start flag 20d to ON or OFF based on an operation by a user of the data transmission and reception system 1. The data acquisition determination unit 20c determines whether the DQ signal has been successfully acquired when the reference voltage and a phase of the DQS signal are changed.

The data acquisition determination register 20e stores the determination results obtained by the data acquisition determination unit 20c. Further, as illustrated in FIG. 2, the data acquisition determination register 20e includes a register for storing data to perform processes to be described below in the present embodiment. As an example, the data acquisition determination register 20e includes a register for storing a value of a reference voltage used to determine the H level and the L level of each of the DQ signals DQ0 to DQ3.

The data acquisition determination register 20e further includes a register used to set a delay tap of each of the DQ signals DQ0 to DQ3. In the present embodiment, the delay tap of the DQ signal is a delay amount of the phase of the DQ signal. The data acquisition determination register 20e further includes a register used by the CPU 10 to set the delay tap of the DQS signal. In the present embodiment, the delay tap of the DQS signal is a delay amount of the phase of the DQS signal. The data acquisition determination register 20e further includes a register used to set a delay tap of the memory clock signal ("CLK" in FIG. 2) which is used for controlling an operation of the memory module. In the present embodiment, a signal of which a phase has been changed based on a CPU clock signal as a reference, which is used to determine an operating frequency of the CPU 10, is used as a memory clock signal. A phase of the memory clock signal to be transmitted to each memory module is determined by a delay tap control unit 90a.

Further, in the present embodiment, each of the delay tap setting units 30b, 30c, 30h, and 30i sets a phase difference between the DQS signal and the DQ signal. Further, the delay tap setting unit 30q sets the phase of the memory clock signal. Further, according to the values set by the respective registers, the reference voltage of the DQ signal, the delay tap of the DQ signal, the delay tap of the DQS signal, and the delay tap of the memory clock signal are determined.

Further, the data acquisition determination register 20e includes a register which is used by the CPU 10 to instruct the MC #0 20 to write/read PRBS data generated by the PRBS generation unit 20b to/from the memory module 70. Further, the data acquisition determination register 20e includes a register which stores the read result of the PRBS data of the DQ0 to DQ3 read from the memory module 70. In the present embodiment, the PRBS generation unit 20b generates the PRBS data of the DQ0 to DQ3. Further, each piece of the generated PRBS data is written to the memory module 70. In addition, each piece of the written data is read. Further, it is determined whether each DQ signal has been successfully read based on whether each data generated by the PRBS generation unit 20b coincides with each piece of the read data. Further, the determination result regarding reading is written to the register in the data acquisition determination register 20e.

Further, in the present embodiment, the various registers described above are housed in the data acquisition determination register 20e. However, the various registers described above may be provided as a another register separately from the data acquisition determination register 20e.

The memory clock signal output from the MC #0 20 is input to the latch circuit 30p of the I/O circuit 30. An internal clock is input to the latch circuit 30p to latch data, and the latched data is input to the delay tap setting unit 30q. The delay tap setting unit 30q determines the delay tap of the memory clock signal. The DQS signal output from the MC #0 20 is input to the latch circuit 30a of the I/O circuit 30. An internal clock is input to the latch circuit 30a to latch data, and the latched data is input to the delay tap setting unit 30b. The delay tap setting unit 30b determines a strobe point of the DQS signal, for example, the delay tap of the DQS signal which is a timing for acquiring the DQ signal. Further, the DQ signal output from the MC #0 20 is input to the latch circuit 30g of the I/O circuit 30. An internal clock is input to the latch circuit 30g to latch data, and the latched data is input to the delay tap setting unit 30h. The delay tap setting unit 30h determines the delay tap of the DQ signal. Further, as an example, four bits DQ0 to DQ3 collectively form a single DQ signal as a group. Further, the DQ signals of the respective bits are transmitted by parallel transmission using different data lines included in the transmission line 50.

The delay tap setting unit 30b controls a delay time of the DQS signal using a step size obtained by dividing a phase width for one period of the DQS signal into $2^N$ pieces (for example, 32 pieces including widths 0 to 31 when N=5). Similarly, the delay tap setting unit 30h controls a delay time of the DQ signal using the unit width. Further, the delay tap setting unit 30q controls a delay time of the memory clock signal using the unit width. Further, he MC #0 20 sets the delay tap setting units 30b, 30c, 30h, 30i, and 30q according to setting values of the various registers in the data acquisition determination register 20e. For example, each of the delay tap setting units 30b and 30h determines a phase difference between the phase of the DQS signal and the phase of the DQ signal as values in a range of −180° to +180°.

The memory clock signal CLK0 of which the delay tap has been determined and the delay time has been adjusted by the delay tap setting unit 30q is output to the transmission line 60 via the driver 30r. The memory clock signal CLK0 is input to the RCD 70n via the receiver 70m of the memory module. After the RCD 70n has adjusted a signal strength and a clock timing of the memory clock signal CLK0, the memory clock signal CLK0 is input to the memory elements 70a and 70b in the memory module 70.

Further, the DQS signal and the DQ signal of which the delay taps have been determined and the delay times have been adjusted by the respective delay tap setting units 30b and 30h are respectively output to the transmission lines 40 and 50 via the drivers 30d and 30j. The DQS signal is input to the Rank0 memory element 70a or the Rank1 memory element 70b via the transmission line 40 and the receiver 70h or the receiver 70j. Further, the DQ signal is input to the Rank0 memory element 70a or the Rank1 memory element 70b via the transmission line 50 and the receiver 70d or the receiver 70f. The memory element 70a or the memory element 70b writes or reads data using the input DQS signal and DQ signal according to a WRITE command or a READ command output from the MC #0 20.

When the READ command is input from the MC #0 20 to the memory element 70a, the memory element 70a outputs the DQS signal and the read DQ signal to the respective transmission lines 40 and 50 via the drivers 70g and 70c in phase. Further, when the READ command is input from the MC #0 20 to the memory element 70b, the memory element 70b outputs the DQS signal and the read DQ signal to the respective transmission lines 40 and 50 via the drivers 70e and 70i in phase.

The DQS signals and the DQ signals output from the memory elements 70a and 70b are respectively input to the receivers 30e and 30k of the I/O circuit 30. The DQS signal is input from the receiver 30e to the delay tap setting unit 30c. Further, the receiver 30k is coupled to the voltage-dividing circuit 30n. The voltage-dividing circuit 30n sets a resistance value according to control by the reference voltage setting unit 30m. Further, the reference voltage is adjusted based on the resistance value determined by the voltage-dividing circuit 30n. The reference voltage is input to the receiver 30k. The receiver 30k includes a comparator (not illustrated) and determines the H level and the L level of the input DQ signal based on the reference voltage.

The delay tap setting unit 30i determines the delay tap of the DQ signal output from the receiver 30k and adjusts the delay time of the DQ signal. In the I/O circuit 30, the delay tap setting units 30c and 30i shift the phases of the DQS signal and the DQ signal, which have been output from the memory element 70a in phase, from each other by, for example, 90°. The DQ signal output from the delay tap setting unit 30i is input to the latch circuit 30f. The DQS signal output from the delay tap setting unit 30c is input to the latch circuit 30f to latch data. The latched data is input to the MC #0 20.

Figure 3:
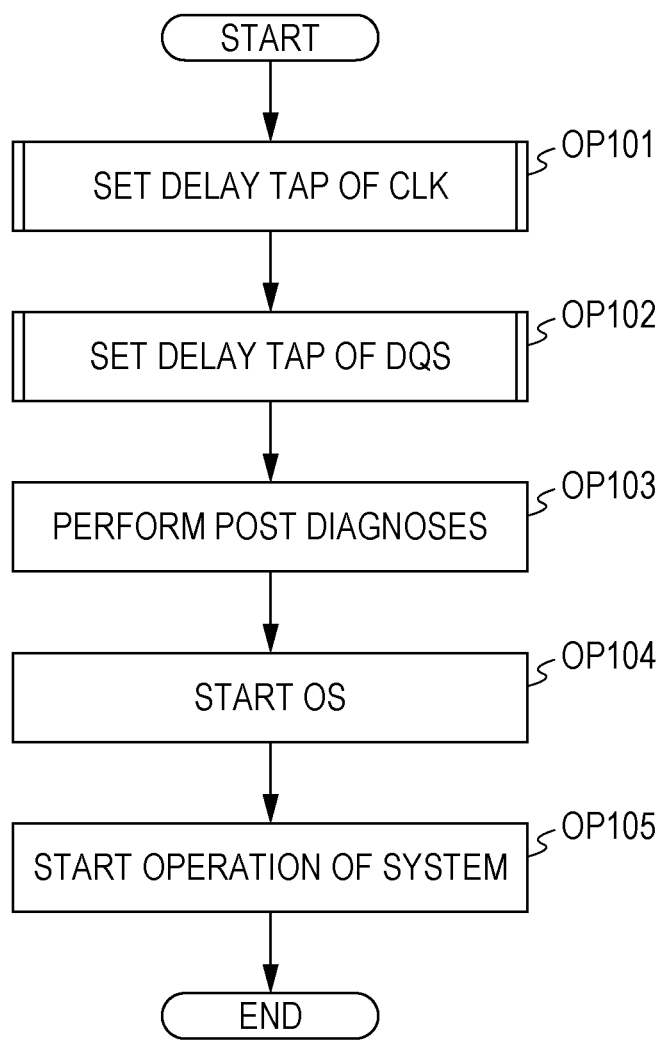
FIG. 3 is a flowchart of processes performed by a data transmission and reception device according to the embodiment.

Next, processes performed according to control by the CPU 10 of the data transmission and reception system 1 according to the present embodiment will be described. When the data transmission and reception system 1 is turned on, the CPU 10 starts processes in the flowchart illustrated in FIG. 3.

In OP 101, the CPU 10 starts a power-on self test (POST) program 90 stored in a nonvolatile memory such as an erasable programmable read-only memory (EPROM) which is not illustrated. The POST program 90 is a program for initial setting of each piece of hardware in the data transmission and reception system 1 and diagnosis to detect an abnormality. The POST program 90 includes a program that functions as the delay tap control unit 90a.

By executing the POST program 90 by the CPU 10, the delay tap control unit 90a controls the phase of the memory clock signal output from each of the MC #0 20, the MC #1 120, the MC #2 220, and the MC #3 320.

Figure 4:
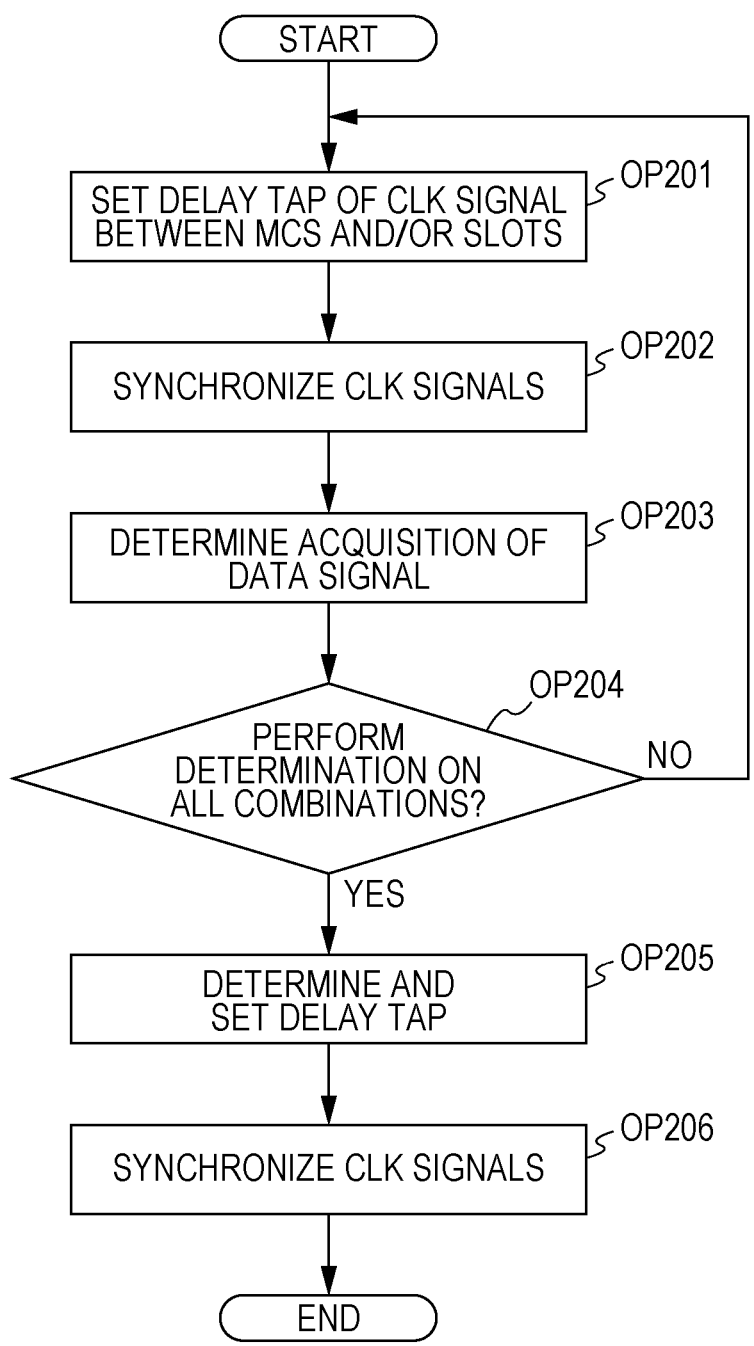
FIG. 4 is a flowchart of processes performed by the data transmission and reception device in OP 101 according to the embodiment.
Figure 5:
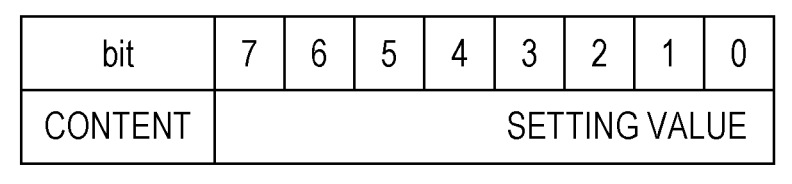

FIG. 4 illustrates an example of processes of a subroutine performed by the CPU 10 in OP 101. In OP 201, the CPU 10 sets the delay taps of the memory clock signals in memory controller unit or memory slot unit, for example, DIMM unit. FIG. 5 illustrates an example of a register which is used when the delay tap of the memory clock signal is set in the present embodiment. The register illustrated in FIG. 5 is housed in a data acquisition determination register in advance. The CPU 10 sets the delay tap of the memory clock signal to be transmitted from each memory controller to the memory module by the delay tap control unit 90a of the POST program 90.

Further, FIG. 6 illustrates an example of a table which is referred to when the delay tap control unit 90a sets the delay tap of the memory clock signal in memory controller unit or memory slot unit. The data in the table is stored in a nonvolatile memory where the POST program is stored, for example. In the table illustrated in FIG. 6, a field of "MC" indicates each memory controller coupled to the CPU 10. Further, a field of "slot" indicates each slot (DIMM) of the memory module coupled to each memory controller. A field of "DQS group" indicates a group when a grouping is performed for each chip for storing data included in each slot of the memory module. Further, details of the group will be described later.

In the table illustrated in FIG. 6, three combinations of the delay taps of the memory clock signals ("Case 1", "Case 2", and Case 3" in FIG. 6) are prepared. "Case 1" and "Case 2" are combinations in which the delay taps of the memory clock signals are set in memory controller unit. "Case 3" is a combination in which the delay taps of the memory clock signals are set in slot unit of the memory controller. Further, in the present embodiment, it is assumed that there are three combinations of the delay taps of the memory clock signals. However, the number of combinations of the delay taps stored in the table illustrated in FIG. 6 is not limited to three. The combination of the delay taps of the memory clock signals set for each memory controller is an example of a combination of phases specified for each of the plurality of data lines included in the transmission line. Further, the combination of the delay taps of the memory clock signals set for each slot of the memory controller is an example of a combination of phases specified for each of the plurality of data lines included in the transmission line.

Further, a field of "delay (ps) [phase](° ]" in each combination indicates a phase difference between the set memory clock signal and the CPU clock signal. As an example, "+⅛[+45]" means a memory clock signal which is shifted by ⅛ cycle, for example, +45° in terms of phase relative to the CPU clock signal of the CPU 10. Further, a field of "transmission amplitude (code)" indicates a width of a DQ signal, which is determined to be successfully acquired in the DQ signal acquisition determination described below, in a direction of the reference voltage. Further, the code is a resolution of a voltage value at the time of setting the reference voltage. Therefore, the larger the value in the field of "transmission amplitude (code)" is, the more successful acquisition of the data signal in the wider range of the reference voltage is.

In OP 201, the delay tap control unit 90a refers to the table illustrated in FIG. 6 and determines a combination of the delay taps from among the combinations in the table. Further, the delay tap control unit 90a stores the determined delay tap of each memory clock signal in the data acquisition determination register of the corresponding memory controller. Each memory controller controls the delay tap setting unit for clock signal in each I/O circuit (delay tap setting unit 30q in FIG. 2) according to the delay tap stored in the data acquisition determination register. As a result, a memory clock signal of which a phase is shifted from the CPU clock signal is transmitted from each I/O circuit to each memory module. Next, the CPU 10 advances the process to OP 202.

Figure 7A:
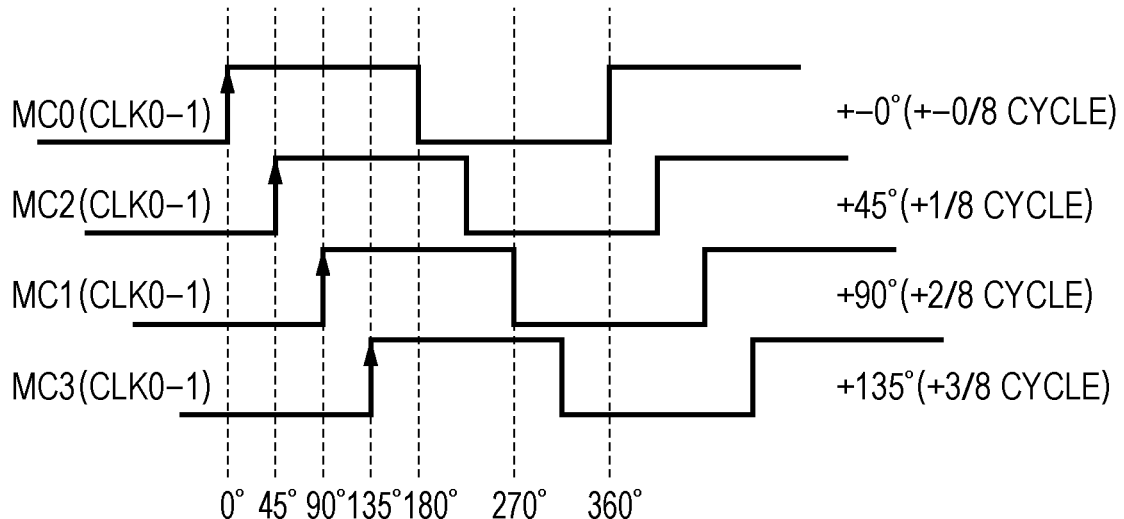
FIGS. 7A and 7B are diagrams illustrating examples of correlation between memory clock signals according to the embodiment.
Figure 7B:
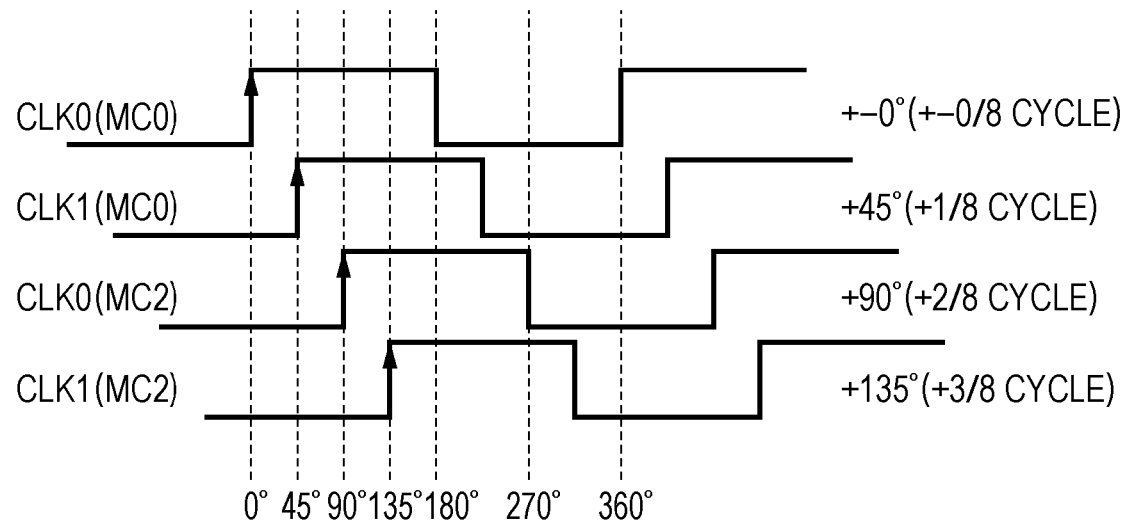

[0042] FIGS. 7A and 7B schematically illustrate examples of an operation of the memory controller in a case where the delay tap is set in OP 201. Further, FIG. 7A illustrates a case where the delay taps of the memory clock signals are shifted in memory controller unit. Further, FIG. 7B illustrates a case where the delay taps of the memory clock signals are shifted in slot unit.

In the example illustrated in FIG. 7A, the delay taps of the memory clock signals (CLK0 and CLK1) output from the I/O circuits of the memory controller MC #0 20 are set so as not to be shifted relative to the phase of the CPU clock signal) (0°). Further, the delay taps of the memory clock signals (CLK0 and CLK1) output from the I/O circuits of the memory controller MC #1 120 are set to be shifted by 45° relative to the phase of the CPU clock signal. Similarly, the delay taps of the memory clock signals (CLK0 and CLK1) output from the I/O circuits of the memory controllers MC #2 220 and MC #3 320 are respectively set to be shifted by 90° and 135° relative to the phase of the CPU clock signal.

further, in the example illustrated in FIG. 7B, the delay tap of the memory clock signal (CLK0) output from the I/O circuit of the memory controller MC #0 20 to the memory module 70 is set so as not to be shifted relative to the phase of the CPU clock signal) (0°). Further, the delay tap of the memory clock signal (CLK1) output from the I/O circuit of the memory controller MC #0 20 to the memory module 170 is set to be shifted by 45° relative to the phase of the CPU clock signal. Similarly, the delay taps of the memory clock signals (CLK0 and CLK1) output from the I/O circuits of the memory controller MC #1 120 to the memory modules 270 and 370 are respectively set to be shifted by 90° and 135° relative to the phase of the CPU clock signal. Further, the delay taps of the memory clock signals output from the I/O circuits of the memory controllers MC #2 220 and MC #3 320 to the memory modules 470, 570, 670, and 770 are similarly set.

The delay tap of the memory clock signal stored in the data acquisition determination register in OP 201 may be different from the delay tap which has been set to the memory controller before the process in OP 201. Therefore, in OP 202, the CPU 10 instructs each memory controller to synchronize the memory clock signals according to the delay tap stored in each data acquisition determination register in OP 201. With this instruction, each memory controller operates in synchronization with the memory clock signal based on the delay tap which has been newly set by the process in OP 201. Next, the CPU 10 advances the process to OP 203.

In OP 203, the subject of the process is changed from the CPU 10 to the MC #0 20. Further, the MC #0 20 sets the reference voltage and the delay tap of each DQ signal and the delay tap of the DQS signal according to setting values of the various registers stored in the data acquisition determination register 20e. Further, the MC #0 20 generates a READ command to read a random pattern of the PRBS written in the memory module 70. The generated READ command is output from the I/O circuit 30 and input to the memory element 70a or 70b via a transmission line (not illustrated) which couples the I/O circuit 30 and the memory module 70. The memory element 70a or 70b that has received the READ command reads stored data according to the READ command and outputs the data to the I/O circuit 30 as the DQ signal together with the DQS signal in phase. The I/O circuit 30 receives the data output from the memory module 70.

Further, in the present embodiment, in a case where data acquisition of the MC #0 20 is determined, the MC #1 120, the MC #2 220, and the MC #3 320 are operated using the random pattern of the PRBS as an example. In this way, by operating the memory controllers other than the memory controller of which the data acquisition is determined, a state where noise interference from the other memory controllers occurs may be simulatively generated.

Figure 8:
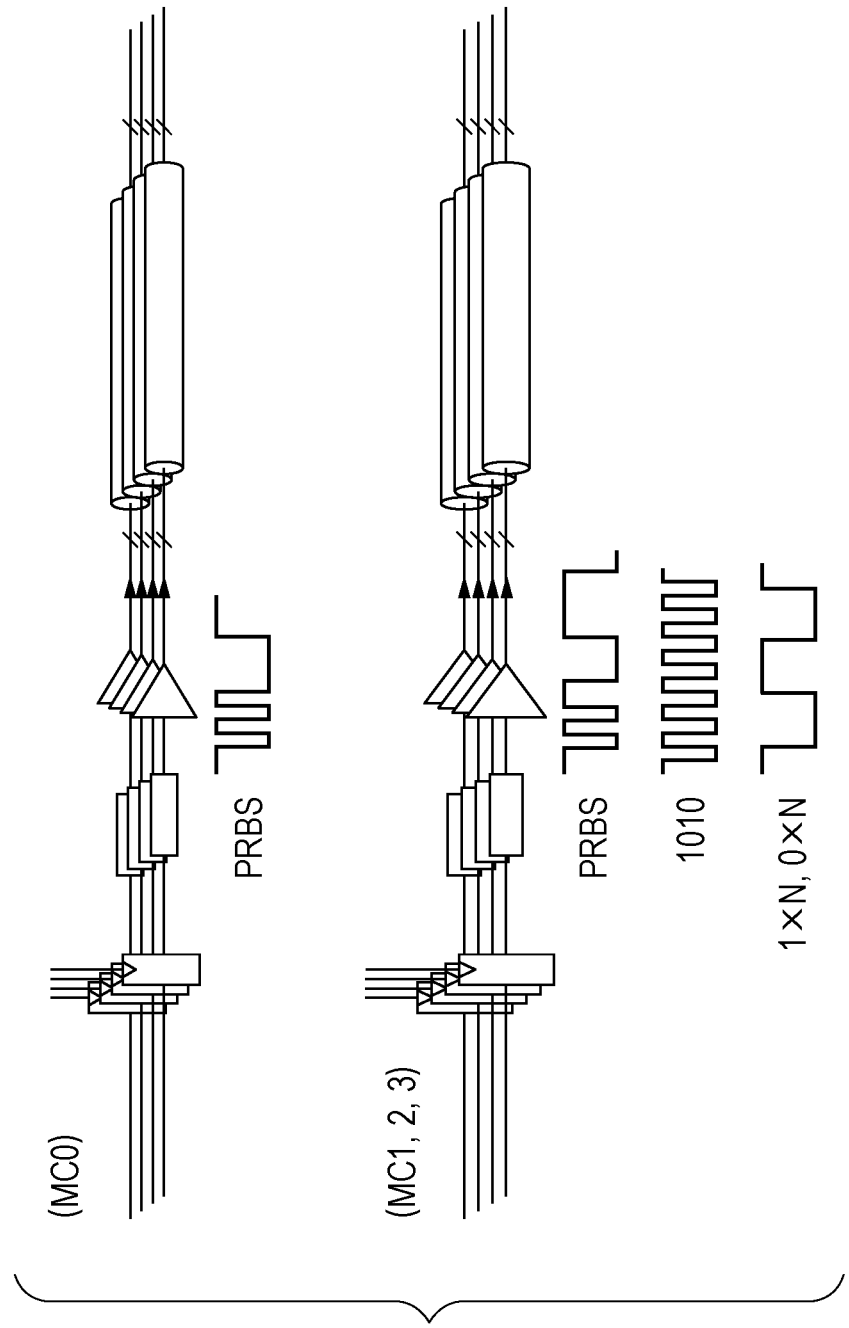
FIG. 8 is a diagram schematically illustrating an example of a signal transmitted from a memory controller according to the embodiment.

For example, as illustrated in FIG. 8, in a case where the data acquisition is determined on the MC #0 20, the MC #0 20 performs data access by the random pattern of the PRBS. Then, the other memory controllers MC #1 120, MC #2 220, and MC #3 320 perform data access by the random pattern of the PRBS used for the MC #0 20 or a pattern in which continuous values of zero and one are regularly arranged (pattern of 0×N and 1×N). The pattern in which the continuous values of zero and one are regularly arranged is a pattern in which N continuous zeros and ones are arranged (N is a natural number). Further, when N=1 is satisfied, the pattern includes the values of zero and the values of one which are alternately and continuously arranged.

Further, the MC #0 20 determines, by the data acquisition determination unit 20c, whether the generated random pattern of the PRBS as described above coincides with the random pattern of the PRBS read from the memory element 70a or 70b according to the READ command. Further, when it is determined that the random patterns of the PRBS coincide with each other, the data acquisition determination unit 20c determines that the data is successfully read with the set reference voltage of the DQ signal and the delay tap of the DQS signal. When it is determined that the random patterns of the PRBS do not coincide with each other, on the other hand, the data acquisition determination unit 20c determines that the data is not successfully read with the set reference voltage of the DQ signal and the delay tap of the DQS signal.

The MC #0 20 stores the determination result on whether the DQ signal has been successfully acquired in the register in the data acquisition determination register 20e. Further, when the MC #0 20 performs the DQ signal acquisition determination process on all the combinations of the reference voltage of the DQ signal and the delay tap of the DQS signal, the process proceeds to OP 204. In OP 204, the subject of the process returns from the MC #0 20 to the CPU 10.

In OP 204, the CPU 10 determines whether the DQ signal acquisition determination process in OP 203 has been performed on all the combinations of the delay taps stored in the table illustrated in FIG. 6. Further, as an example, by providing, in the MC #0 20, a register indicating whether the DQ signal acquisition determination process has been performed on each combination, it is preferable that the CPU 10 perform the determination process in OP 204 with reference to a value of the register. In a case where the DQ signal acquisition determination process has been performed on all the combinations of the delay taps (OP 204: Yes), the CPU 10 advances the process to OP 205. On the other hand, in a case where there is a combination of the delay taps on which the DQ signal acquisition determination process has not been performed (OP 204: No), the CPU 10 returns the process to OP 201. Further, the CPU 10 sets the delay taps in OP 201 according to the combination of the delay taps on which the acquisition determination process has not been performed.

In OP 205, the CPU 10 determines a combination with which the DQ signal may be successfully acquired in a wider range in the direction of the reference voltage of the DQ signal than the other combinations, from among the combinations of the delay taps illustrated in FIG. 6 based on the DQ signal acquisition determination result in OP 203. Further, the CPU 10 sets the delay tap of the memory clock signal of each memory controller according to the determined combination.

In OP 205, the CPU 10 functions as a determination unit. In a case where the second data transmission and reception device is operated according to the combination of phases based on information including a plurality of combinations of phases in which a phase of a timing signal relative to each data signal is specified for each of the plurality of data lines included in the transmission line, the CPU 10 determines a combination of phases of which a range of a voltage to be a reference to determine whether the data signal may be acquired is wider than a range of a voltage in which the data signal may be acquired with the other combination of the phases included in the above information. The CPU 10 also functions as a control unit and controls the second data transmission and reception device based on the combination of the phases determined by the determination unit. Next, the CPU 10 advances the process to OP 206.

In OP 206, as in OP 202, the CPU 10 instructs each memory controller to synchronize the memory clock signals according to the delay tap stored in each data acquisition determination register in OP 205. With this instruction, each memory controller operates in synchronization with the memory clock signal based on the delay tap which has been newly set by the process in OP 201. When the process in OP 206 is completed, the CPU 10 terminates the process of the subroutine and advances the process to OP 102.

Figure 9:
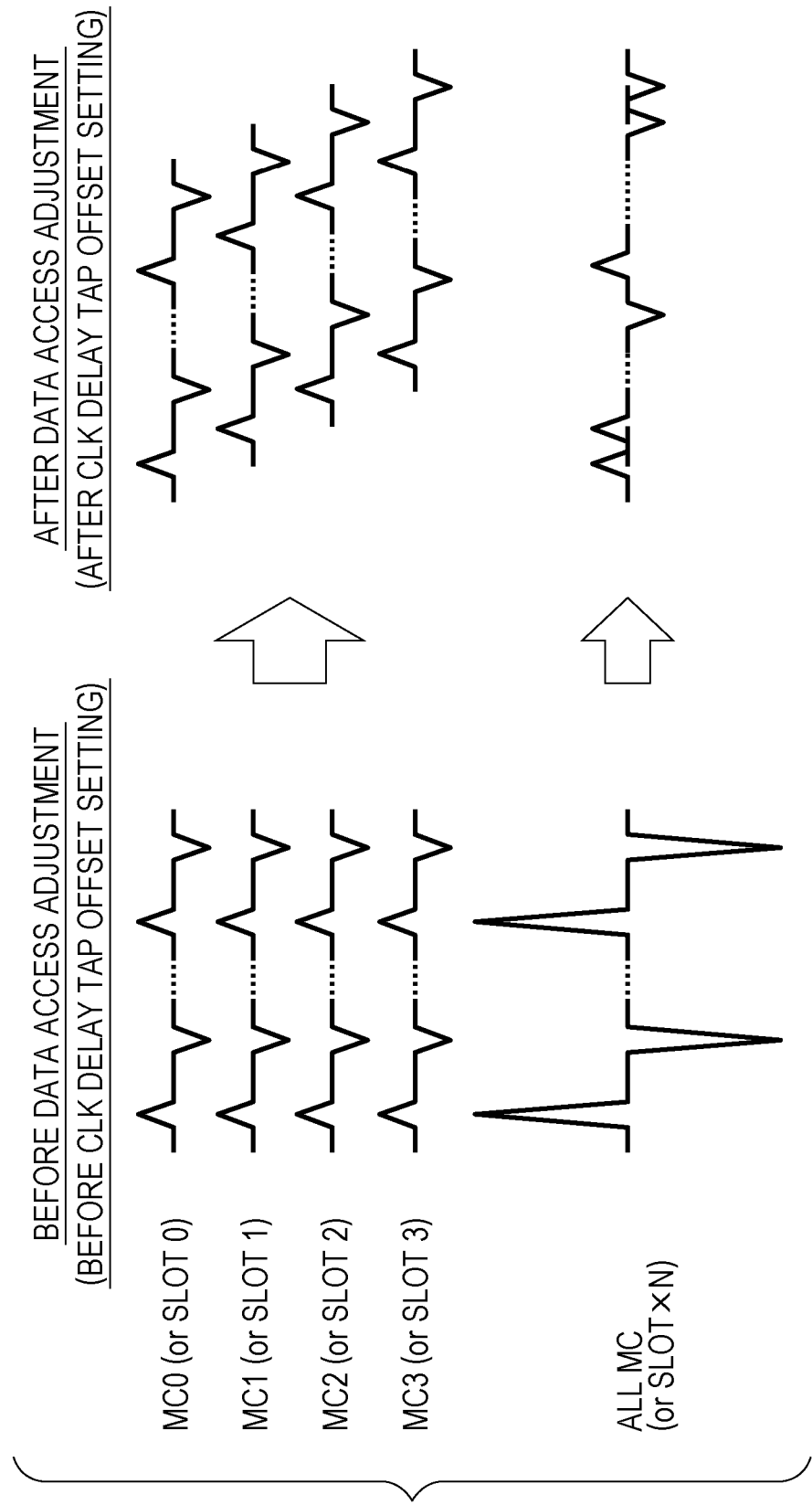
FIG. 9 is a diagram schematically illustrating an example of noises before and after delay tap setting according to the embodiment.

FIG. 9 schematically illustrates noises of signals transmitted between the memory controllers and the memory modules in a case where the delay taps of the memory clock signals are set by the above process. In FIG. 9, the horizontal axis indicates time, and the vertical axis indicates a signal level of a noise component. A noise included in a signal before the delay tap of the memory clock signal is newly determined by the above process is amplified by simultaneous access ("before data access adjustment" in FIG. 9). Further, after the delay tap of the memory clock signal has been newly determined by the above process, overlap of noise waveforms is dispersed and the noise components of the signal offset each other so that the amount of the noise is reduced ("after data access adjustment" in FIG. 9).

Figure 10:
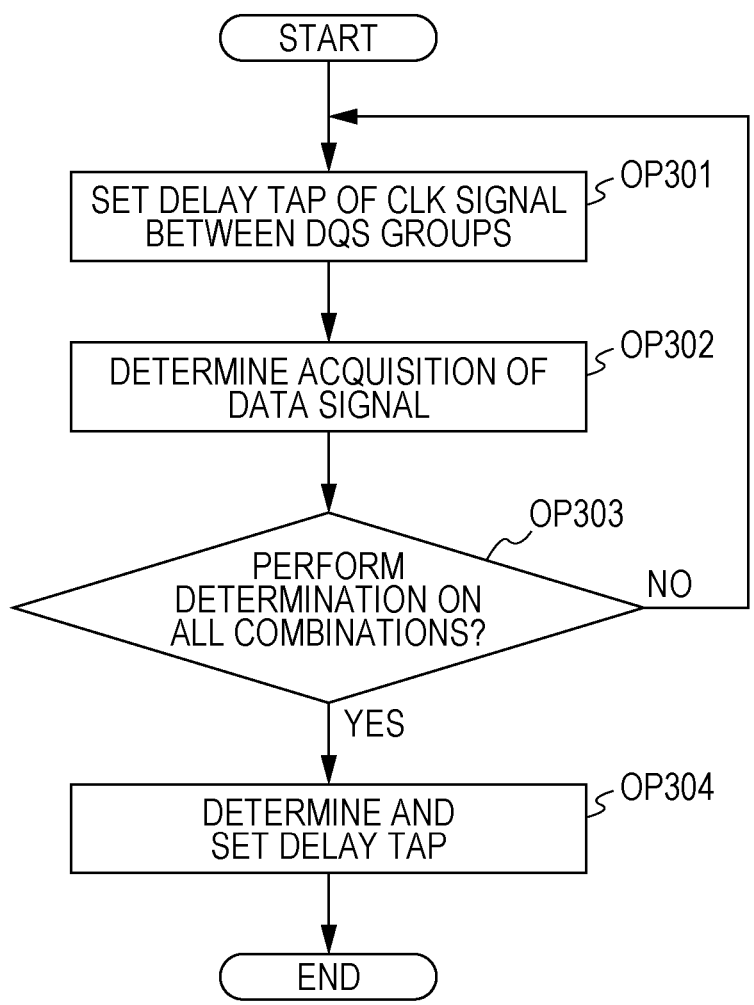
FIG. 10 is a flowchart of processes performed by the data transmission and reception device in OP 102 according to the embodiment.

Next, a subroutine process performed by the CPU 10 in OP 102 will be described with reference to FIG. 10. In OP 301, the CPU 10 sets the delay taps of the DQS signals in DQS group unit determined for each slot of the memory module. Here, the DQS group in the present embodiment will be described with reference to the example in FIG. 11.

Figure 11:
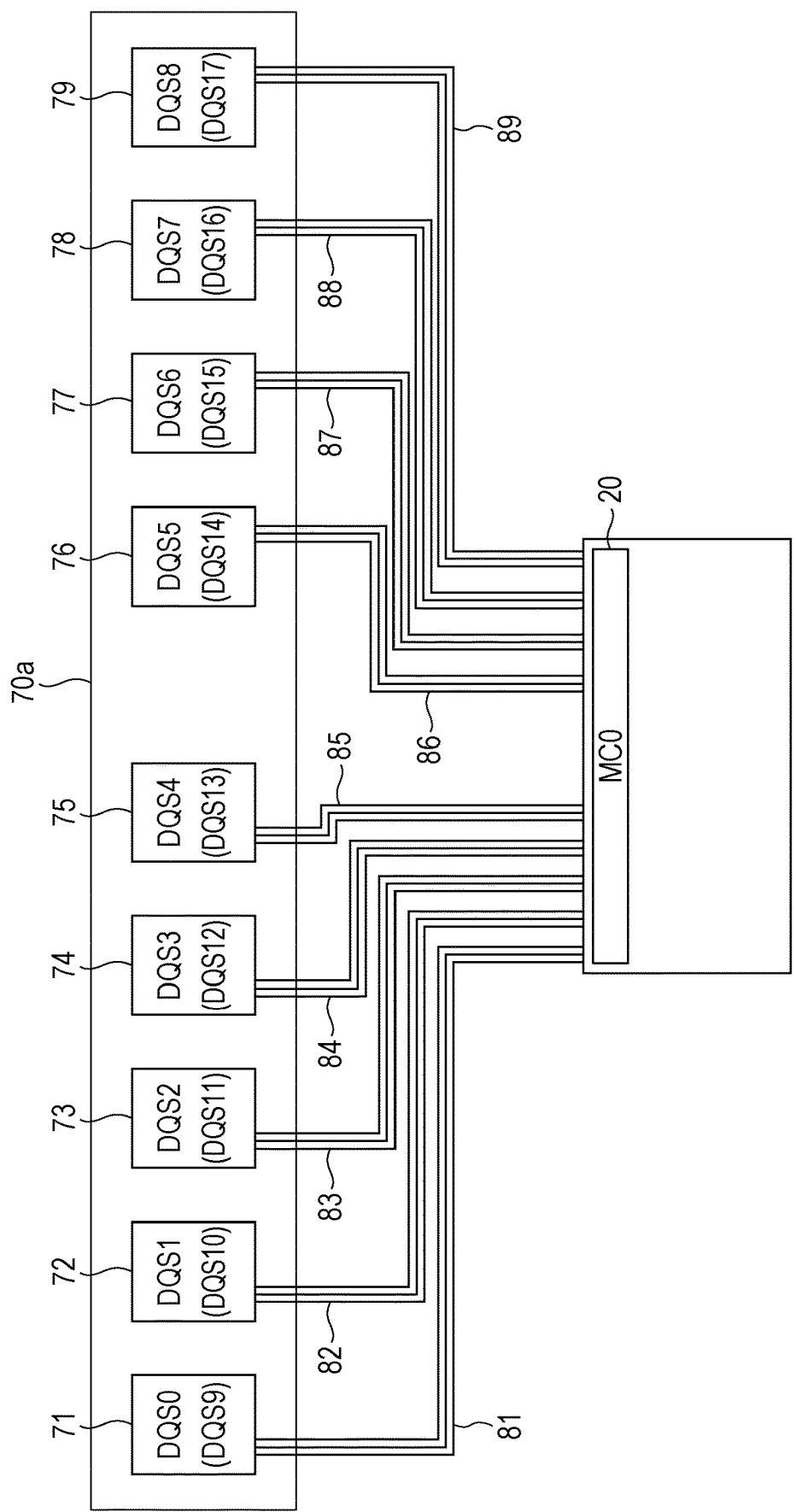
FIG. 11 is a diagram illustrating an exemplary configuration of a memory module according to the embodiment.

FIG. 11 schematically illustrates an exemplary configuration of one memory element 70*a* of the memory module 70. Further, it is assumed that the other memory elements are similarly configured. In FIG. 11, chips provided on a surface of the memory element 70*a* are illustrated. As illustrated in FIG. 11, as an example, the single memory element 70*a* includes nine chips 71 to 79, and the memory controller MC #0 20 transmits and receives a DQS signal and four DQ signals for each chip (for example, DQ signals DQ0 to DQ3 in a case of the chip 71). The memory controller MC #0 20 is connected to the chips 71 to 79 via different data lines 81 to 89, respectively. In FIG. 11, the DQS signals transmitted to the chips 71 to 79 are respectively indicated as DQS0 to DQS8.

In the present embodiment, nine chips are provided on each of the principal surface and the rear surface of the memory element 70*a*. Further, the chips are divided into groups according to the chip configuration on the memory element. The arrangement of the chips on the rear surface is similar to that on the principal surface, and DQS signals transmitted to the nine chips on the rear surface are respectively indicated as DQS9 to DQS17. Further, in FIG. 11, the DQS signals DQS9 to DQS17 transmitted to the respective chips on the rear surface are illustrated so as to overlap the chips 71 to 79, respectively.

In this way, in the present embodiment, each group of the chips which are grouped based on the DQS signal transmitted to each chip of the memory element is referred to as the DQS group. In the example in FIG. 11, a group of the chips to which the DQS signals DQS0, DQS1, DQS9, and DQS10 are transmitted is referred to as a DQS group 1. Similarly, a group of the chips to which the DQS signals DQS2, DQS3, DQS4, DQS11, and DQS12 are transmitted is referred to as a DQS group 2. Further, a group of the chips to which the DQS signals DQS5, DQS6, DQS13, and DQS14 are transmitted is referred to as a DQS group 3. Further, a group of the chips to which the DQS signals DQS7, DQS8, DQS15, DQS16, and DQS17 are transmitted is referred to as a DQS group 4.

Further, the number of chips included in each DQS group and the DQS group to which the chip belongs may be appropriately determined for each data line which couples the memory controller and the chip. Further, the memory controller sets the delay taps of the DQS signals for each DQS group so as to adjust an acquisition timing of the DQ signal in group unit based on the chip of the memory element of the memory module. Further, the delay taps of the DQS signals set for each DQS group is an example of the combination of the phases specified for each of the plurality of data lines included in the transmission line.

FIG. 12 illustrates an example of a table which is referred to when the delay tap control unit 90*a* sets the delay taps of the DQS signals in DQS group unit. Further, data of the table is stored in the nonvolatile memory where the POST program is stored, as an example. In the table illustrated in FIG. 12, the DQS signals are collectively written in a field of "DQS group" for each DQS group. Further, a field of "DQ" indicates the DQ signal acquired by each of the DQS signals DQS0 to DQS17. For example, "DQ [3: 0]" in FIG. 12 means the DQ signals DQ0 to DQ3.

In the table illustrated in FIG. 12, three combinations of the delay taps of the DQS signals set for each DQS group ("Case 1", "Case 2", and "Case 3" in FIG. 12) are prepared. A field of "cycle (tCK) [phase](° )" of each combination indicates a phase difference between the set DQS signal and the CPU clock signal. "tCK" means a single cycle of a clock signal. Therefore, for example, "⅛ tCK" means ⅛ cycle of the clock signal. Further, as an example, "+⅛[+45]" means a DQS signal which is shifted from the CPU clock signal of the CPU 10 by +⅛ cycle, for example, +45° in terms of the phase. Further, a field of "transmission amplitude (code)" indicates a width of a DQ signal, which is determined to be successfully acquired in the DQ signal acquisition determination, in the direction of the reference voltage. Further, the code is a resolution of a voltage value at the time of setting the reference voltage. Therefore, the larger the value in the field of "transmission amplitude (code)" is, the more successful acquisition of the DQ signal in the wider the range of the reference voltage is.

Figure 13:
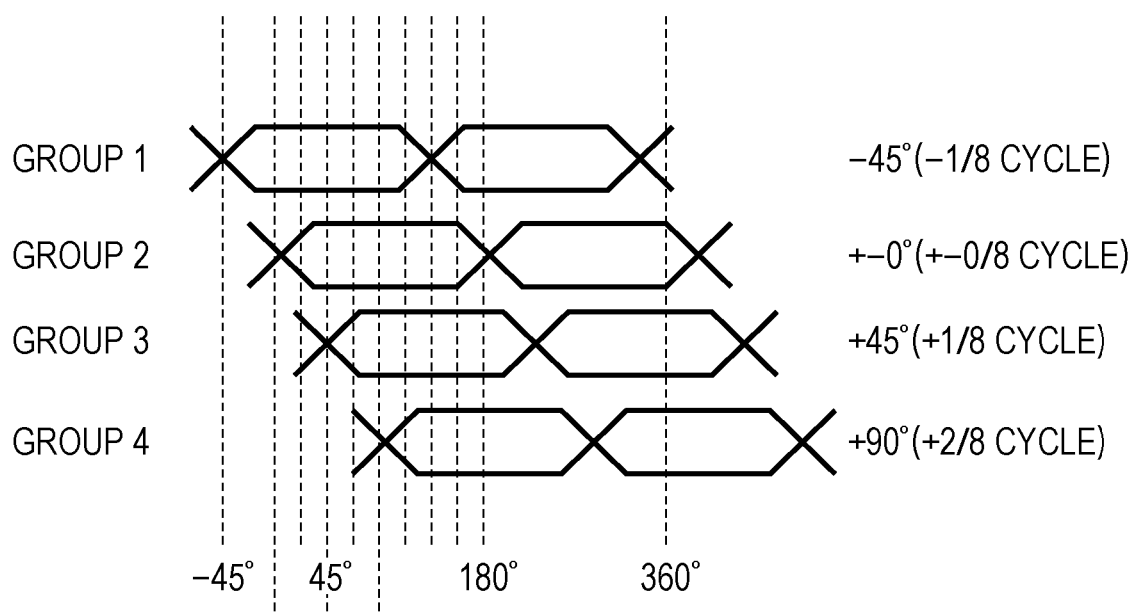
FIG. 13 is a diagram illustrating another example of correlation between memory clock signals according to the embodiment.

Further, FIG. 13 illustrates an example of a phase of a DQ signal in a case where the delay taps of the DQS signals are set for each DQS group based on the combination "Case 1" of the delay taps in the table illustrated in FIG. 12. The horizontal axis indicates time, and the vertical axis indicates a signal level. In the present embodiment, each memory controller is operated in a state where the phases of the DQ signals in the DQS group are shifted from the phases of the DQ signals in the other DQS groups according to the table illustrated in FIG. 12.

In OP 302, the subject of the process is changed from the CPU 10 to the MC #0 20. Further, the MC #0 20 sets the reference voltage and the delay tap of each DQ signal and the delay tap of the DQS signal according to setting values of the various registers stored in the data acquisition determination register 20*e*. Further, the MC #0 20 generates a READ command to read a random pattern of the PRBS written in the memory module 70. The generated READ command is output from the I/O circuit 30 and input to the memory element 70*a* or 70*b* via a transmission line which couples the I/O circuit 30 and the memory module 70. The memory element 70*a* or 70*b* that has received the READ command reads stored data according to the READ command and outputs the data to the I/O circuit 30 as the DQ signal together with the DQS signal in phase. The I/O circuit 30 receives the data output from the memory module 70.

Further, in the present embodiment, as in OP 203, in a case where data acquisition of the MC #0 20 is determined, the other MC #1 120, the MC #2 220, and the MC #3 320 are operated using the random pattern of the PRBS described above as an example. Further, the other memory controllers MC #1 120, MC #2 220, and MC #3 320 may perform data access by the pattern in which the continuous values of zero and one are regularly arranged instead of the random pattern of the PRBS used for the MC #0 20.

Further, the MC #0 20 determines, by the data acquisition determination unit 20c, whether the described-above generated random pattern of the PRBS coincides with the random pattern of the PRBS read from the memory element 70a or 70b according to the READ command. Further, when it is determined that the random patterns of the PRBS coincide with each other, the data acquisition determination unit 20c determines that the data is successfully read with the set reference voltage of the DQ signal and the delay tap of the DQS signal. When it is determined that the random patterns of the PRBS do not coincide with each other, on the other hand, the data acquisition determination unit 20c determines that the data is not successfully read with the set reference voltage of the DQ signal and the delay tap of the DQS signal.

The MC #0 20 stores the determination result on whether the DQ signal has been successfully acquired in the register in the data acquisition determination register 20e. Further, when the MC #0 20 performs the DQ signal acquisition determination process on all the combinations of the reference voltage of the DQ signal and the delay tap of the DQS signal, the process proceeds to OP 303. In OP 303, the subject of the process returns from the MC #0 20 to the CPU 10.

In OP 303, the CPU 10 determines whether the DQ signal acquisition determination process in OP 302 has been performed on all the combinations of the delay taps stored in the table illustrated in FIG. 12. As an example, by providing, in the MC #0 20, a register indicating whether the DQ signal acquisition determination process has been performed on each combination, it is preferable that the CPU 10 perform the determination process in OP 303 with reference to a value of the register. In a case where the DQ signal acquisition determination process has been performed on all the combinations of the delay taps (OP 303: Yes), the CPU 10 advances the process to OP 304. On the other hand, in a case where there is a combination of the delay taps on which the DQ signal acquisition determination process has not been performed (OP 303: No), the CPU 10 returns the process to OP 301. The CPU 10 sets the delay taps in OP 301 according to the combination of the delay taps on which the acquisition determination process has not been performed.

In OP 304, the CPU 10 determines a combination with which the DQ signal may be successfully acquired in a wider range in the direction of the reference voltage of the DQ signal than the other combinations, from among the combinations of the delay taps illustrated in FIG. 11 based on the DQ signal acquisition determination result in OP 302. The CPU 10 sets the delay taps of the DQS signals for each DQS group in the memory element 70a of the memory module 70 according to the determined combination.

In OP 304, the CPU 10 functions as a determination unit. In a case where the second data transmission and reception device is operated according to the combination of phases based on information including a plurality of combinations of phases in which a phase of a timing signal relative to each data signal is specified for each of the plurality of data lines included in the transmission line, the CPU 10 determines a combination of phases of which a range of a voltage to be a reference to determine whether the data signal may be acquired is wider than a range of a voltage in which the data signal may be acquired with the other combination of the phases included in the above information. The CPU 10 also functions as a control unit and controls the second data transmission and reception device based on the combination of the phases determined by the determination unit. When the process in OP 304 is completed, the CPU 10 terminates the process of the subroutine and advances the process to OP 103.

Figure 14:
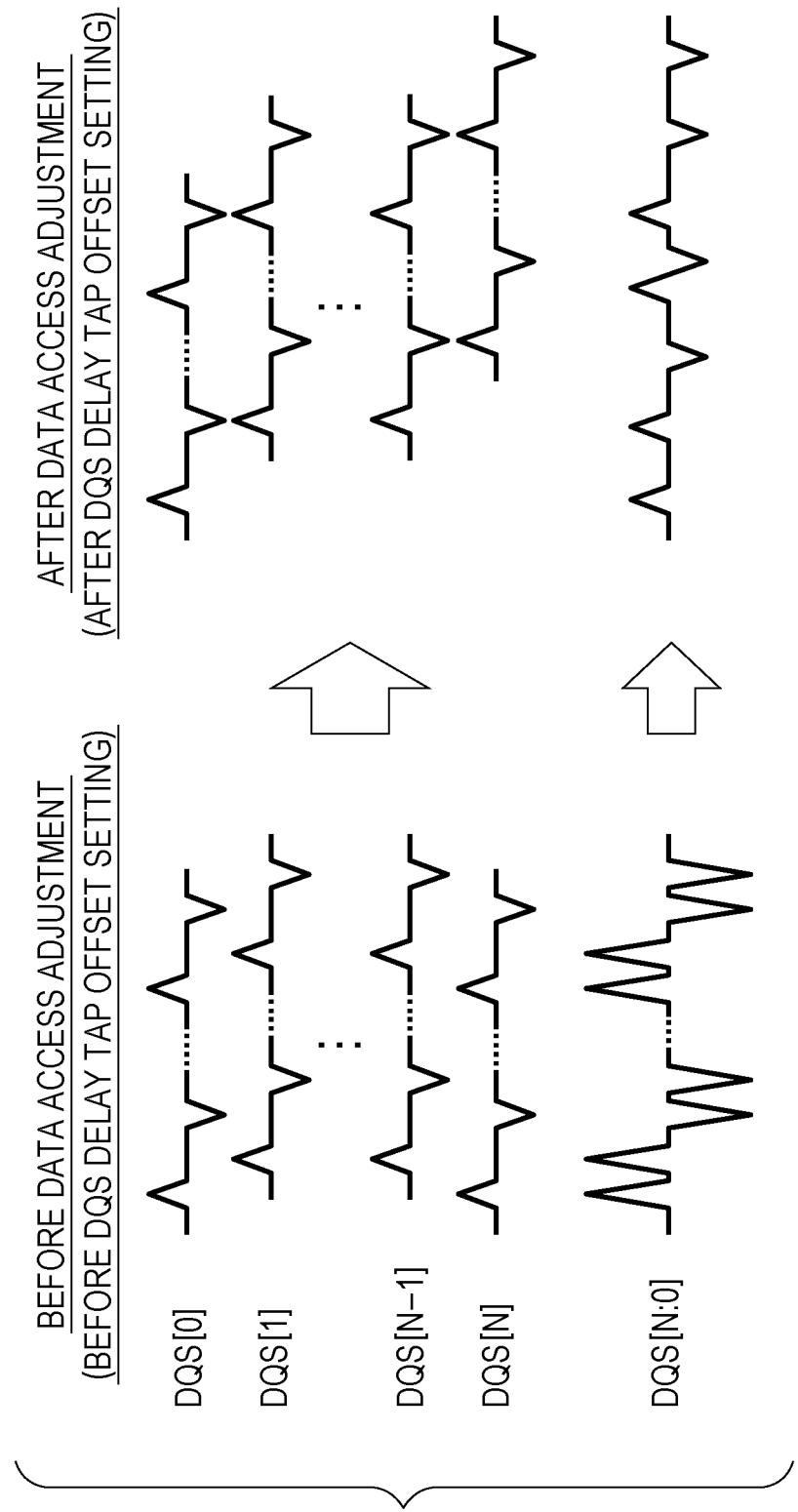
FIG. 14 is a diagram schematically illustrating another example of noises before and after delay tap setting according to the embodiment.

FIG. 14 schematically illustrates noises of signals transmitted between the memory controllers and the memory modules in a case where the delay taps of the DQS signals are set according to the processes in OP 301 to OP 304 described above. In FIG. 14, it is assumed that the delay taps are set for each of N DQS groups. In FIG. 14, the horizontal axis indicates time, and the vertical axis indicates a signal level of a noise component. The noise included in signals of each DQS group (DQS [0] to DQS [N] in FIG. 14) before the delay tap of the DQS signal is newly determined by the above process is amplified by simultaneous access (DQS [N:0] in "before data access adjustment" in FIG. 14). Further, after the delay tap of the DQS signal has been newly determined by the above process, overlap of noise waveforms is dispersed and the noise components of the signal offset each other so that the amount of the noise is reduced ("DQS [N:0] in after data access adjustment" in FIG. 14).

In OP 103, the CPU 10 diagnoses an operation of each piece of hardware in the data transmission and reception system 1 by the POST program. Next, in OP 104, the CPU 10 starts the operating system (OS) after executing the POST program to start various processes of the data transmission and reception system 1. Further, data access between the CPU and each memory module is performed according to the combination of the delay taps of each signal determined by the above process.

Figure 15:
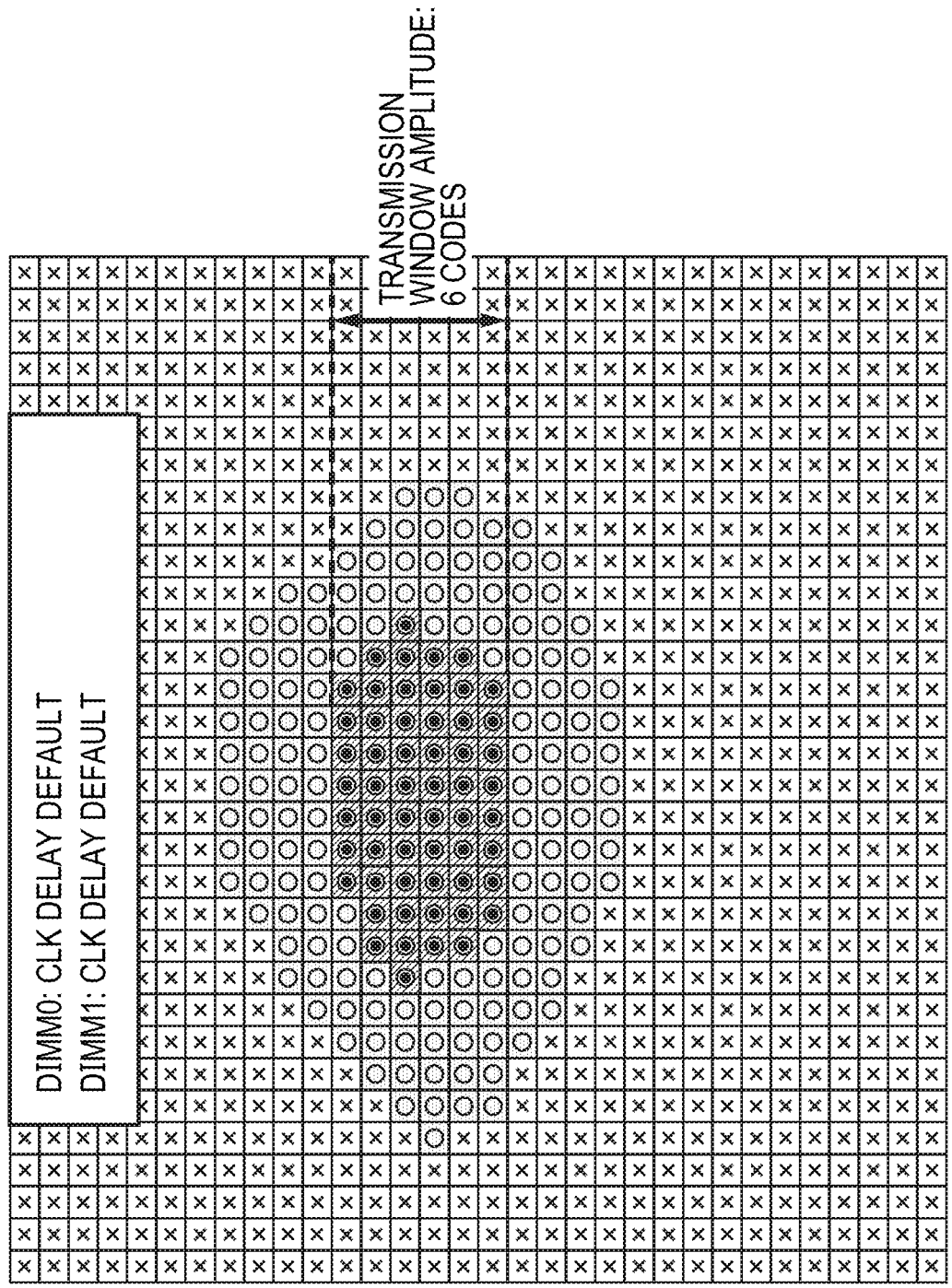
FIG. 15 is a diagram illustrating an example as to whether a data signal is acquired according to a combination of delay taps according to the embodiment.
Figure 16:
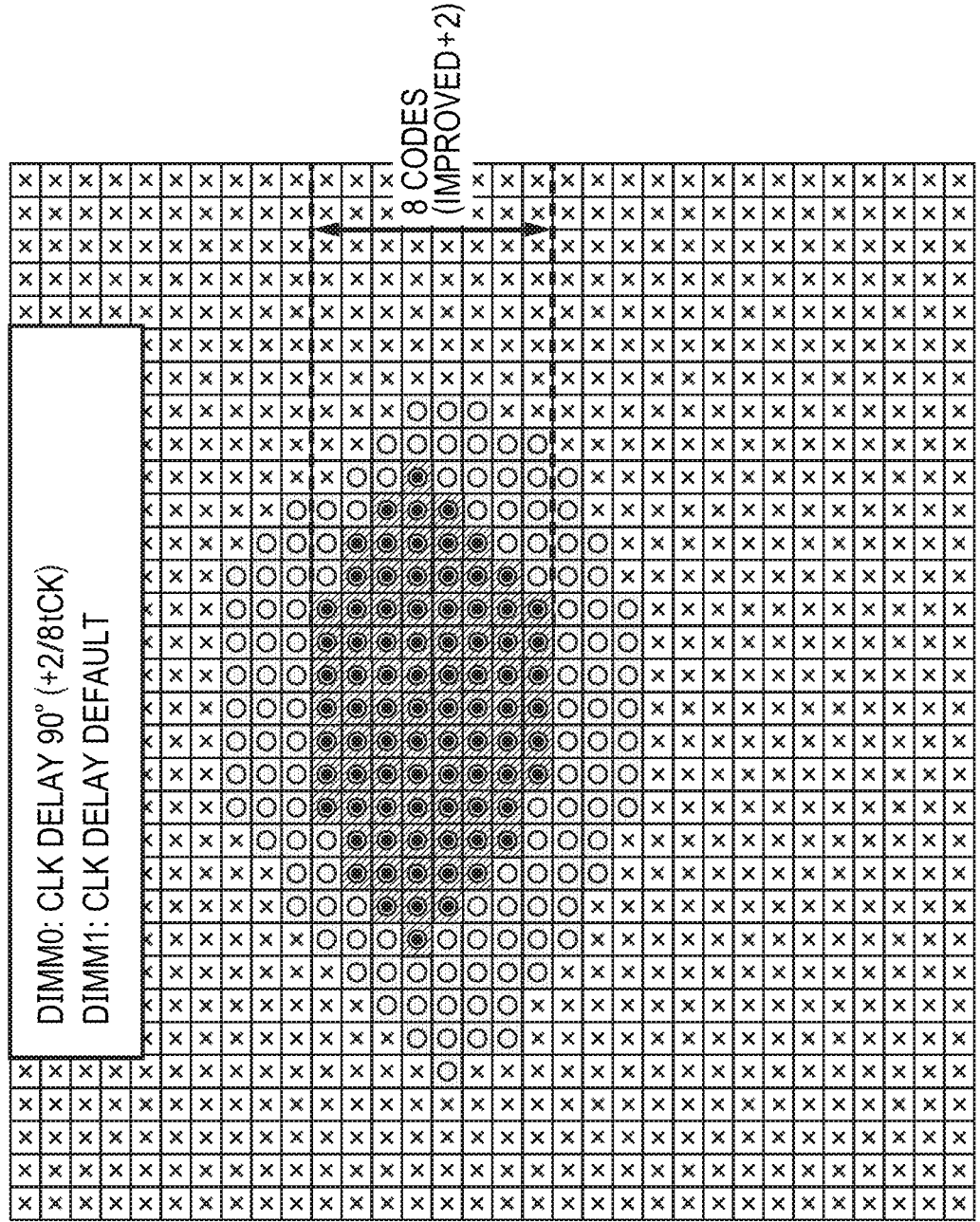
FIG. 16 is a diagram illustrating an example as to whether a data signal is acquired according to a combination of delay taps different from the combination in FIG. 15 according to the embodiment.
Figure 17:
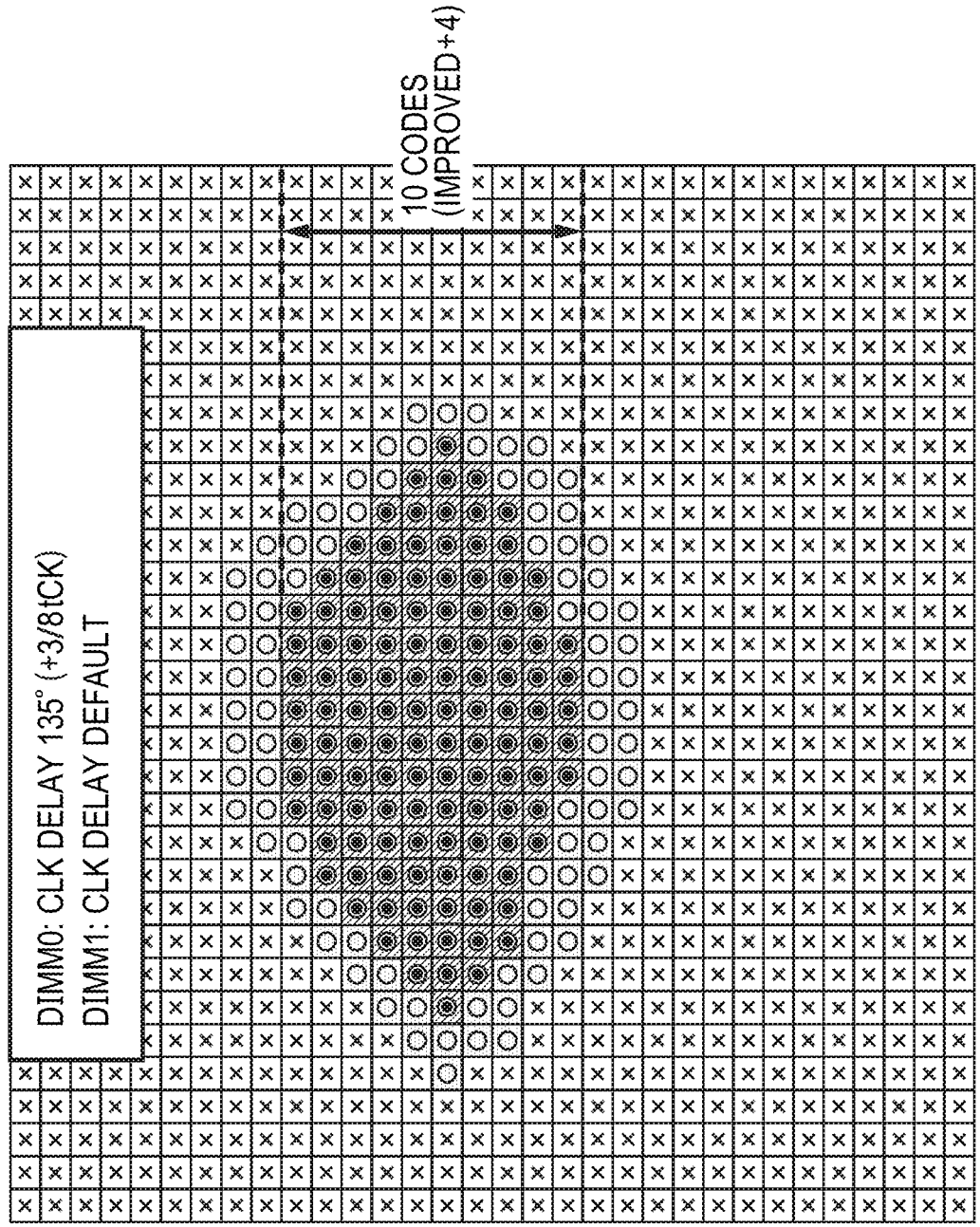
FIG. 17 is a diagram illustrating an example as to whether a data signal is acquired according to a combination of delay taps different from the combinations in FIGS. 15 and 16 according to the embodiment.

FIGS. 15 to 17 schematically illustrate examples of data acquisition determination result based on the combination of the delay taps of the memory clock signals in above OP 101 in the present embodiment. FIGS. 15 to 17 illustrate, as an example, results regarding three combinations of the delay taps in a case where the memory module includes a DIMM0 and a DIMM1 and the delay taps of the DQS signals are set for each DIMM by the above process. In each of FIGS. 15 to 17 illustrating the result of each combination, the horizontal axis indicates the delay tap of the DQS signal, and the vertical axis indicates the reference voltage of the DQ signal. Further, in each figure, for reference, a mark "x" indicates a case where the acquisition of the DQ signal has failed, and a mark "o" indicates a case where the DQ signal is successfully acquired when only the memory controller to be determined is operated. Further, a mark "⊙" indicates a case where the DQ signal is successfully acquired when the memory controller to be determined and the memory controller other than the memory controller to be determined are operated according to the present embodiment.

As illustrated in FIG. 15, in a case where the delay taps of the memory clock signals relative to the DIMM0 and the DIMM1 are not shifted from the phase of the CPU clock signal ("CLK delay: default" in FIG. 15), the DQ signals are successfully acquired for six codes. FIG. 16 illustrates a case where the delay tap of the memory clock signal relative to the DIMM0 is shifted from the phase of the CPU clock signal by 90° and the delay tap of the memory clock signal relative to the DIMM1 is not shifted from the phase of the CPU clock signal. In this case, the DQ signals are successfully acquired for eight codes. Further, FIG. 17 illustrates a case where the delay tap of the memory clock signal relative to the DIMM0 is shifted from the phase of the CPU clock signal by 135° and the delay tap of the memory clock signal relative to the DIMM1 is not shifted from the phase of the CPU clock signal. In this case, the DQ signals are successfully acquired for 10 codes. Therefore, a combination of the delay taps in which the delay tap of the memory clock signal relative to the DIMM0 is shifted from the phase of the CPU clock signal by 135° and the delay tap of the memory clock signal relative to the DIMM1 is not shifted from the phase of the CPU clock signal has a higher success rate of the DQ signal acquisition than the other combinations. According to the present embodiment, the combination of the delay taps which has a higher success rate of the DQ signal acquisition is determined, and the memory controller may be operated according to the combination.

According to the present embodiment, delay tap setting in memory controller unit, DIMM unit, or DQS group unit is optimized so as to reduce interference noise which is caused when a plurality of memory controllers is operated. Here, the memory controller unit is an example of each of the plurality of control devices. Further, the DIMM unit is an example of each of the plurality of second data transmission and reception devices. The DQS group unit is an example of each of the plurality of regions where the data transmitted and received by the data signals is stored. Further, by optimizing the delay tap setting in component unit of the memory module, quality of the data acquisition process at the time of data access between the CPU and each memory module is improved. For example, in the present embodiment, in addition to the delay tap setting between the CPU and the single memory module in the related art, the reference voltage is adjusted again under an environment in which noises are generated. As a result, even when the data transmission and reception system 1 is actually operated or in a test program environment in which an actual operation of the data transmission and reception system 1 is simulated, an optimum reference voltage for the data acquisition process may be determined.

Further, the size and the shape of each noise waveform exemplified above vary depending on the process of the CPU and the differences between the memory elements in the memory module. According to the present embodiment, since the above process is performed in the flow in the POST program after the system is turned on, delay tap adjustment optimum for the combination of various kinds of hardware may be performed without being affected by the differences between the hardware such as the memory module and the CPU.

The present embodiment has been described above. However, the configuration and the process of the above data transmission and reception system 1 and the like are not limited to the above embodiment, and various changes may be made within the range in which the technical idea of the present invention remains the same. For example, in the above embodiment, the combination of the delay taps is determined through OP 101 and OP 102. However, the combination of the delay taps may be determined through either one of OP 101 and OP 102.

<Computer-Readable Recording Medium>

It is possible to record, on a computer-readable recording medium, a program that causes a computer and other machines and devices (referred to as computer and the like below) to implement a management tool, an OS, and the like for setting of the above data transmission and reception device. Further, the computer is caused to read and execute the program in the recording medium so that the computer may provide its function. Here, the computer is, for example, an information processing device, a server system, a management server or the like.

Here, the computer-readable recording medium is a recording medium that accumulates information such as data and programs by electrical, magnetic, optical, mechanical, or chemical action and may be read by the computer and the like. Among such recording media, a recording medium that is removable from the computer and the like is, for example, a flexible disk, a magneto-optical disk, a CD-ROM, a CD-R/W, a DVD, a Blu-ray disk, a DAT, an 8-mm tape, a memory card such as a flash memory or the like. Further, a recording medium fixed to the computer and the like is, for example, a hard disk and a read only memory (ROM).

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A data transmission and reception system comprising:
   a first data transmission and reception device;
   a second data transmission and reception device connected to the first data transmission and reception device via a transmission line; and
   a plurality of control devices that are coupled to the first data transmission and reception device and the second data transmission and reception device and control transmission and reception of a data signal and a timing signal indicating a timing to acquire the data signal between the first data transmission and reception device and the second data transmission and reception device,
   the first data transmission and reception device:
      determines, based on information including a plurality of second combinations which each includes a plurality of first combinations of a phase of the timing signal relative to each data signal and a transmission amplitude corresponding to a resolution for a reference voltage which is used to determine whether the data signal is acquired in the second data transmission and reception device and which are specified for the respective plurality of control devices, a second combination which has a maximum transmission amplitude in a case where the second data transmission and reception device is operated according to each of the plurality of second combinations; and
      controls the second data transmission and reception device based on the determined second combination.

2. The data transmission and reception system according to claim 1, wherein the transmission amplitude having a larger value indicates the more successful acquisition of the data signal in the second data transmission and reception device.

3. The data transmission and reception system according to claim 1, comprising: two or more second data transmission and reception devices including the second data transmission and reception device, wherein the first combinations are specified for the respective two or more second data transmission and reception devices.

4. The data transmission and reception system according to claim 1, wherein the second data transmission and reception device includes a plurality of regions that store data transmitted and received by the data signal and are coupled to a plurality of data lines included in the transmission line, and the first combinations are specified for the respective plurality of regions.

5. The data transmission and reception system according to claim 1, wherein the first data transmission and reception device is an arithmetic processing device, the second data transmission and reception device is a memory that stores data transmitted and received by the data signal, and each of the control devices is a memory control device that controls the memory according to control of the arithmetic processing device.

6. A data transmission and reception device comprising:
a memory configured to store a program; and
a processor coupled to a storage device which stores a data signal via a transmission line and is coupled to a plurality of control devices which control transmission and reception of the data signal and a timing signal indicating a timing to acquire the data signal and configured to preform, based on the program, a process to:
determines, based on information including a plurality of second combinations which each includes a plurality of first combinations of a phase of the timing signal relative to each data signal and a transmission amplitude corresponding to a resolution for a reference voltage which is used to determine whether the data signal is acquired in the second data transmission and reception device and which are specified for the respective plurality of control devices, a second combination which has a maximum transmission amplitude in a case where the storage device is operated according to each of the plurality of second combinations; and
controls the storage device based on the determined second combination.

7. The data transmission and reception device according to claim 6, wherein the transmission amplitude having a larger value indicates the more successful acquisition of the data signal in the second data transmission and reception device.

8. The data transmission and reception device according to claim 6, wherein the processor is coupled to two or more storage devices including the storage device, and the first combinations are specified for the respective two or more storage devices.

9. The data transmission and reception device according to claim 6, wherein the storage device includes a plurality of regions that store data transmitted and received by the data signal and are coupled to a plurality of data lines included in the transmission line, and the first combinations are specified for the respective plurality of regions.

10. The data transmission and reception device according to claim 9, wherein the first data transmission and reception device is an arithmetic processing device, the storage device is a memory that stores data transmitted and received by the data signal, and each of the control devices is a memory control device that controls the memory according to control of the arithmetic processing device.

11. A method of controlling a data transmission and reception system comprising:
determining, by a first data transmission and reception device in the data transmission and reception system including a second data transmission and reception device coupled to the first data transmission and reception device via a transmission line and a plurality of control devices that are coupled to the first data transmission and reception device and the second data transmission and reception device and control transmission and reception of a data signal and a timing signal indicating a timing to acquire the data signal between the first data transmission and reception device and the second data transmission and reception device, based on information including a plurality of second combinations which each includes a plurality of first combinations of a phase of the timing signal relative to each data signal and a transmission amplitude corresponding to a resolution for a reference voltage which is used to determine whether the data signal is acquired in the second data transmission and reception device and which are specified for the respective plurality of control devices, a second combination which has a maximum transmission amplitude in a case where the second data transmission and reception device is operated according to each of the plurality of second combinations; and
controlling the second data transmission and reception device based on the determined second combination.

12. The method according to claim 11, wherein the transmission amplitude having a larger value indicates the more successful acquisition of the data signal in the second data transmission and reception device.

13. The method according to claim 11, wherein the data transmission and reception system includes two or more second data transmission and reception devices including the second data transmission and reception device, wherein the first combinations are specified for the respective two or more second data transmission and reception devices.

14. The method according to claim 11, wherein the second data transmission and reception device includes a plurality of regions that store data transmitted and received by the data signal and are coupled to a plurality of data lines included in the transmission line, and the first combinations are specified for the respective plurality of regions.

15. The method according to claim 11, wherein the first data transmission and reception device is an arithmetic processing device, the second data transmission and reception device is a memory that stores data transmitted and received by the data signal, and each of the control devices is a memory control device that controls the memory according to control of the arithmetic processing device.

* * * * *